United States Patent
Peron (10) Patent No.: US 6,900,601 B2
(45) Date of Patent: May 31, 2005

(54) CONTROL CIRCUIT OF TWO CURRENT UNIDIRECTIONAL SWITCHES

(75) Inventor: Benoît Peron, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/698,809

(22) Filed: Oct. 31, 2003

(65) Prior Publication Data

US 2004/0135618 A1 Jul. 15, 2004

(30) Foreign Application Priority Data

Oct. 31, 2002 (FR) .......................................... 02 13685

(51) Int. Cl.⁷ ................................................ G05F 1/00
(52) U.S. Cl. .................. 315/291; 315/287; 315/209 R; 315/194; 323/218; 323/212; 361/18
(58) Field of Search ................................ 315/194, 216, 315/209 R, 224, 226, 227 R, 238, 240, 275, 287, 291; 323/212, 223, 239, 237, 218, 320, 324; 361/16, 18; 363/127

(56) References Cited

U.S. PATENT DOCUMENTS

| | | | |
|---|---|---|---|
| 3,878,451 A | | 4/1975 | Ostlund et al. |
| 4,933,798 A | * | 6/1990 | Widmayer et al. ............ 361/18 |
| 5,796,599 A | * | 8/1998 | Raonic et al. ................ 363/57 |
| 6,208,126 B1 | | 3/2001 | Gonthier |
| 6,255,806 B1 | | 7/2001 | Seppanen et al. |
| 2002/0047535 A1 | | 4/2002 | Moindron |

FOREIGN PATENT DOCUMENTS

AU    721986 B    7/2000

OTHER PUBLICATIONS

French Search Report for FR 0213685, Aug. 21, 2003.

\* cited by examiner

Primary Examiner—Haissa Philogene
(74) Attorney, Agent, or Firm—Lisa K. Jorgenson; Bryan A. Santarelli; Graybeal Jackson Haley LLP (57) ABSTRACT

A circuit for controlling two switches assembled in anti-parallel, comprising in series between two terminals of the anti-parallel assembly, two identical control stages respectively dedicated to each switch and between which is interposed a common impedance setting a phase angle for the turning-on of the switches, each stage comprising: a controllable current source for providing a current to a control electrode of the concerned switch; a capacitor for storing a supply voltage of at least the current source; an element of activation/deactivation of a the current source according to the voltage across the stage capacitor; and an assembly for discharging the capacitor.

32 Claims, 5 Drawing Sheets

CONTROL CIRCUIT OF TWO CURRENT UNIDIRECTIONAL SWITCHES

This application claims priority from French patent application No. 02/13685, filed Oct. 31, 2002, which is incorporated herein by reference.

BACKGROUND OF THE INVENTION

1. Field of the Invention

The present invention relates generally to the control of loads supplied by an A.C. voltage and, more specifically, to the field of power dimmers of a resistive or inductive load.

The present invention more specifically relates to the forming of a power dimmer based on switches bidirectional for the voltage and unidirectional for the current which are assembled in anti-parallel. A recurrent problem then concerns the supply of the respective control circuits of the two switches.

2. Discussion of the Related Art

Figure 1:
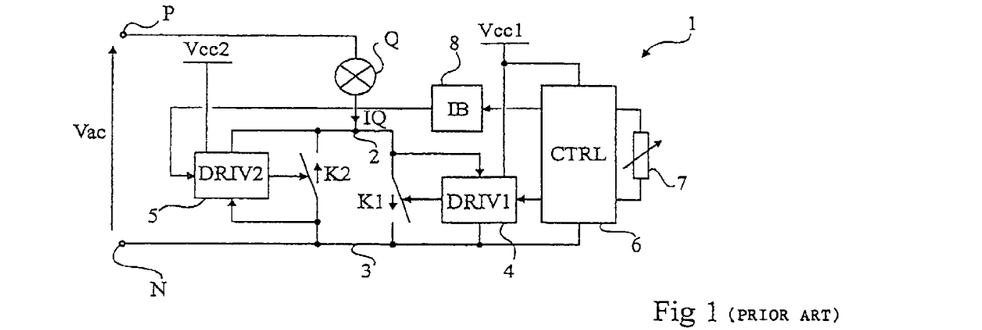
FIG. 1, previously described, shows a conventional example of a circuit for controlling two unidirectional switches assembled in anti-parallel.
Figure 2A:
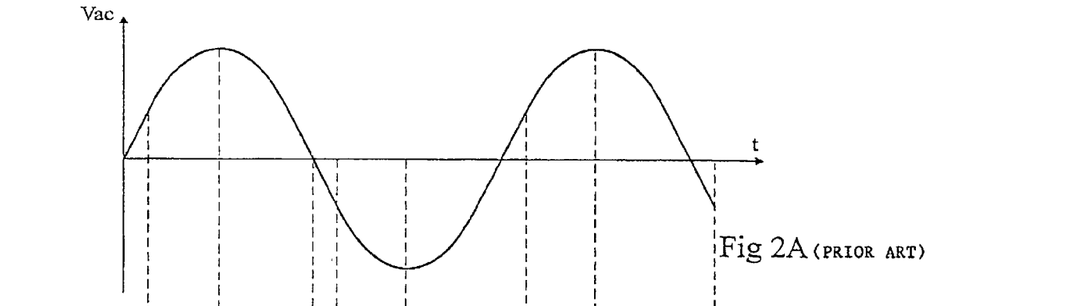
FIGS. 2A to 2D illustrate, in the form of timing diagrams, the operation of the circuit of FIG. 1.
Figure 2B:
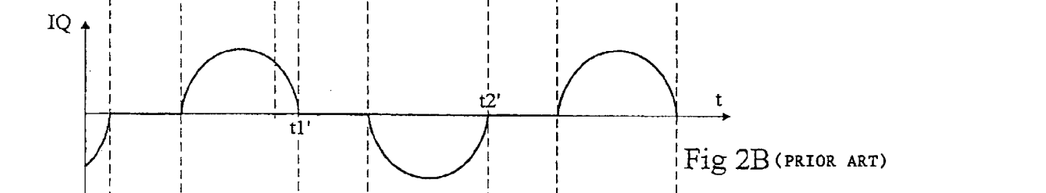
Figures 2C, 2D:
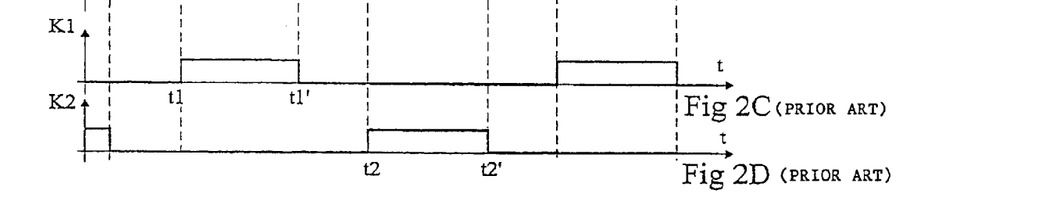

FIG. 1 schematically shows a conventional example of a circuit 1 for controlling a load Q supplied by an A.C. voltage Vac. Two switches K1 and K2 are assembled in anti-parallel between two power terminals 2 and 3 of the dimmer, connected in series with load Q between two terminals P and N of application of A.C. voltage Vac. Each switch K1, K2 has its control terminal connected to the output of a respective circuit 4 (DRIV1) and 5 (DRIV2), generating an appropriate control signal based on control reference values received from a common control circuit (CTRL) 6. Circuit 6 receives a power reference intended for the load, for example, by means of a potentiometer 7 adjusting a reference voltage exploited by circuit 6.

FIGS. 2A to 2D illustrate the operation of the power dimmer of FIG. 1, the principle of which is a phase angle control. FIGS. 2A to 2D respectively show examples of shapes of voltage Vac, of current IQ in load Q, and of the on periods of switches K1 and K2.

It is assumed that load Q is an inductive load, whereby its current is phase-shifted with respect to the A.C. voltage.

The phase angle control consists of controlling the turn-on time of one of switches K1 or K2 according to the considered halfwave, starting from the beginning of the A.C. supply halfwave. Indeed, for each halfwave, respective turn-on times t1 and t2, of switches K1 or K2 cause the occurrence of a current in the load to be controlled. The turning-off of the on switch (time t1', t2', respectively) is controlled by a detection of the disappearing of current IQ in the load, which reproduces a triac-type operation. Since an inductive load is assumed, times t1' and t2', respectively, of switch turn-off, and thus of the disappearing of the current in the load, are shifted with respect to the zero-crossing times of A.C. voltage Vac.

The constraints to be fulfilled by a control circuit such as illustrated in FIG. 1 are to provide the reference voltages to the control electrodes of the semiconductor switches, to transfer the information from control circuit 6 to the circuit (here, 5) which does not have the same voltage reference, and to detect the zero crossing of the current in the conductive switch.

In conventional circuits of this type, the fulfilling of these constraints imposes use of two independent external power supplies to provide voltages Vcc1 and Vcc2, and thus generally of a transformer. Further, the information transfer for the stage (for example, 5) which does not have the same reference voltage as control circuit 6 requires an isolation barrier 8 (IB) of the optocoupler, pulse transformer, or level shifter type.

Further, to enable turning off at the current zeroes in the load and thus avoiding overvoltages adversely affecting the turning-off, each circuit 4, 5 typically has an input terminal connected to a power terminal of the dimmer (respectively, terminal 2 for switch K1 and terminal 3 for switch K2). In practice, this generally leads to providing a sense resistor (not shown) in series with each of the switches to measure the voltage zeroes that correspond to the current zeroes. Such a resistor generates undesirable losses when the switch is in the on state.

SUMMARY OF THE INVENTION

An embodiment of the present invention aims at providing a control circuit for two switches unidirectional in current and assembled in antiparallel, which circuit overcomes disadvantages of conventional circuits.

Another embodiment of the present invention more specifically aims at providing a control circuit which does not require generation of independent external supply voltages.

Another embodiment of the present invention also aims at providing a solution which requires no isolation barrier to transfer a control reference value.

Another embodiment of the present invention further aims at avoiding the presence of a current shunt (resistor or Hall probe) in series with each switch to detect the current zero in the load.

Another embodiment of the present invention also aims at providing a control circuit implementable in integrated circuit form, and compatible with the forming of a bidirectional switch in the form of a dipole, comprising two switches unidirectional in current, and of their control circuit.

Another embodiment of the present invention provides a circuit for controlling two switches bidirectional for the voltage and unidirectional for the current, assembled in anti-parallel, comprising in series between two terminals of the anti-parallel assembly, two identical control stages respectively dedicated to each switch and between which is interposed a common impedance setting a phase angle for the turning-on of the switches, each stage comprising:

a controllable current source for providing a current to a control electrode of the concerned switch;

a capacitor for storing a supply voltage of at least the current source;

an element of activation/deactivation of the current source according to the voltage across the stage capacitor; and an assembly for discharging the capacitor during the operation of the other stage.

According to an embodiment of the present invention, said current source is sized to control the di/dt upon turning-on of the concerned switch.

According to an embodiment of the present invention, said discharge assembly is activated from as soon as the current in the concerned switch is canceled.

According to an embodiment of the present invention, the capacitor of each stage is in series with a first diode, between the impedance and the stage terminal which is the same as the terminal of the anti-parallel assembly.

According to an embodiment of the present invention, a second diode of each stage connects said impedance with said terminal of the stage, which is the same as the anti-parallel assembly terminal.

According to an embodiment of the present invention, a third diode connects the control electrode of the switch of each stage to the electrode of said capacitor, so that said discharge assembly also discharges the control electrode of the stage switch.

According to an embodiment of the present invention, the respective switch of each stage provides the power supply necessary to all stage components.

According to an embodiment of the present invention, said activation/deactivation element activates said current source with which it is associated when the voltage across the capacitor of the stage becomes greater than a first threshold, itself greater than the threshold voltage of the concerned switch.

According to an embodiment of the present invention, said comparator deactivates said current source with which it is associated when the voltage across the capacitor of the stage becomes greater than a second threshold, itself preferably smaller than said threshold voltage of the concerned switch.

According to an embodiment of the present invention, each discharge assembly comprises a first transistor in parallel with the stage capacitor, the control electrode of the first transistor being connected, via a second transistor, to said impedance.

According to an embodiment of the present invention, said activation/deactivation element of each stage is formed of a comparator receiving on a first input the voltage across the stage capacitor and on a second input a reference voltage, said comparator being supplied by the voltage across the capacitor of the concerned stage.

According to an embodiment of the present invention, said impedance is formed of a potentiometer.

According to an embodiment of the present invention, said impedance is formed of a first resistor in parallel with a second switchable resistor, said first resistor having a much greater value than the second one.

An embodiment of the present invention also provides a power dimmer for a load.

An embodiment of the present invention also provides a circuit for controlling a motor.

Features and advantages of the present invention will be discussed in detail in the following non-limiting description of specific embodiments in connection with the accompanying drawings.

DETAILED DESCRIPTION

Same elements have been designated with same reference numerals in the different drawings. For clarity, only those circuit elements which are necessary to the understanding of the present invention have been shown in the drawings and will be described hereafter. In particular, the load controllable by the circuit embodiments of the present invention has not been detailed, the embodiments of the present invention applying whatever the resistive and/or inductive load to be controlled by an A.C. supply voltage, and of which the operating power is desired to be modulated according to a reference value.

Figure 3:
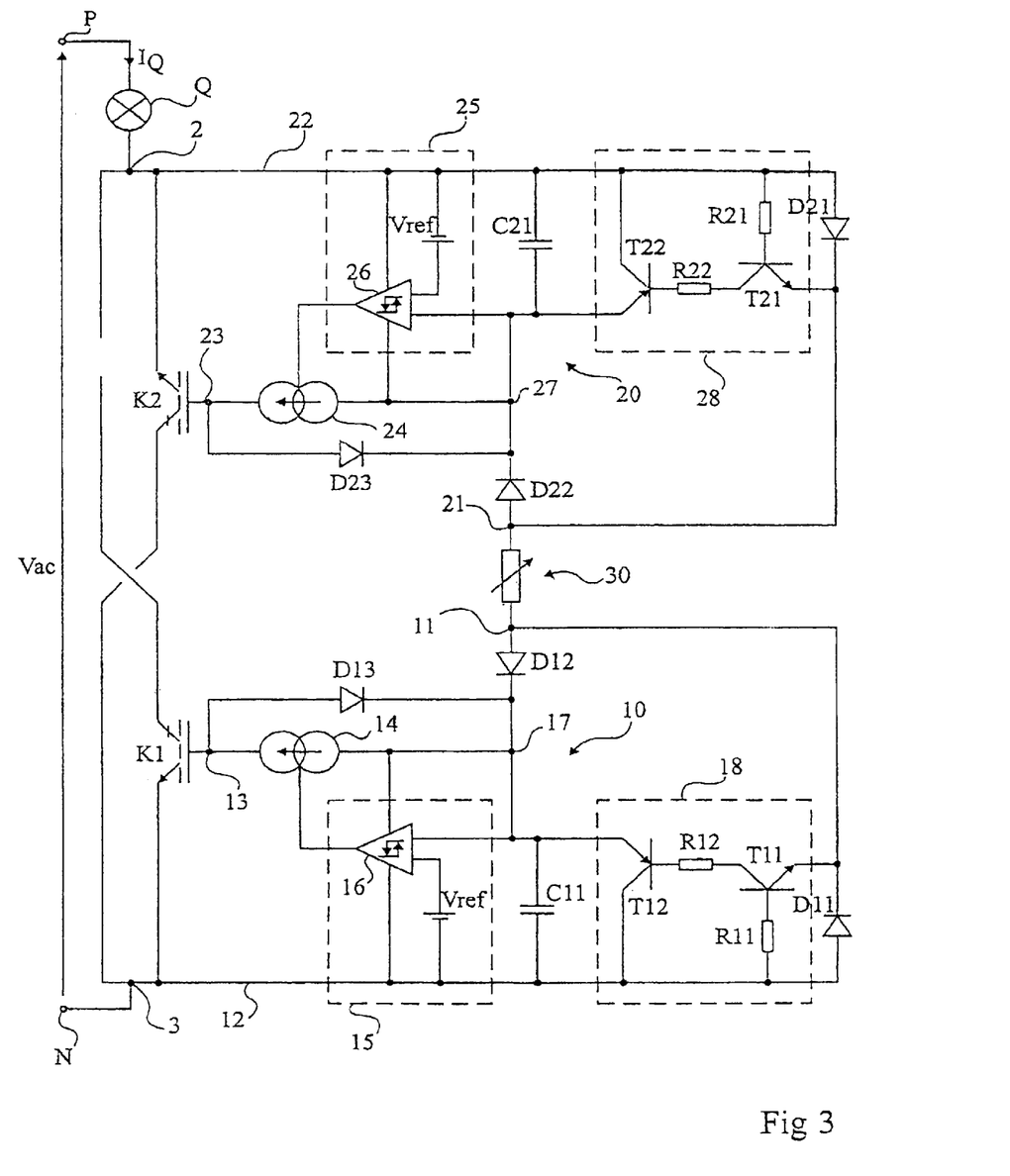
FIG. 3 shows an embodiment of a control circuit according to the present invention.

FIG. 3 shows an embodiment of a circuit for controlling two switches according to the present invention.

As previously, two switches K1 and K2 unidirectional in current are connected in anti-parallel between two terminals 2 and 3 defining a switch bidirectional in voltage and current, assembled in series with a load Q between two terminals P and N of application of an A.C. voltage Vac. In the example of FIG. 3, it is assumed that switches K1 and K2 are MBS-type semiconductor components, also called RGIGBT. As will be detailed in relation with FIG. 5A, such switches have the same operation as an IGBT transistor, integrating a protection diode, which makes them bidirectional for the voltage. This diode is symbolized by a line on the switch collector.

According to this embodiment of the present invention, each switch K1, K2 is associated with a dedicated control stage 10, 20. Stages 10 and 20 are identical and are connected to each other by a common impedance 30 setting the phase angle for the switch turning-on. In FIG. 3, the common impedance is formed of a potentiometer 30 having its two terminals respectively connected to stages 10 and 20. Each stage 10, 20 has a tripolar structure, that is, it comprises two terminals, respectively 11 and 12 and 21 and 22, connected between common impedance 30 and the respective emitter of MBS transistors K1 and K2, and an output terminal, 13 and 23, respectively, for respectively controlling switches K1 and K2. A difference with respect to the conventional control circuit of FIG. 1, for which the stages assigned to the respective switches require five terminals, can already be noted.

The structure of a control stage according to this embodiment of the present invention will be described hereafter in relation with control stage 10 of switch K1. Control stage 20 of switch K2 exhibits exactly the same structure and its components are referenced in FIG. 3 by reference numerals starting with number 2 and not with number 1.

Stage 10 comprises a controllable current source 14 having its output connected to control terminal 13 of switch K1 and which is intended to control its turning on. For example, current source 14 is a constant current source controlled by an activation/deactivation element 15. According to this embodiment of the present invention, element 15 activates current source 14 according to the voltage across a capacitor C11 functionally in series with potentiometer 30 between terminals 2 and 3 of the switch, the impedance of potentiometer 30 thus conditioning the phase angle for the turning-on of switch K1.

In the example of FIG. 3, the current source activation/deactivation element is formed of a hysteresis comparator 16 having a first input connected to the electrode of capacitor C11 opposite to terminal 3 and having a second input receiving a reference voltage Vref provided, for example, by a zener diode of a circuit for generating a voltage reference of bandgap type.

According to this embodiment of the present invention, capacitor C11 also has the function of supplying stage 10 during the halfwaves (for example, positive) assigned to stage 10. Thus, capacitor C11 provides the supply voltage of current source 14 enabling it to activate switch K1 as well as the supply voltage of the activation/deactivation element (more specifically, of comparator 16), the respective supply terminals of which are connected to terminals 17 and 12 of capacitor C11.

To assign stage 10 to a single type of halfwaves, here, positive halfwaves, a diode D12 connects terminal 11 of impedance 30 to electrode 17 of the capacitor. This diode D12 having its anode connected to terminal 11 is forward biased during positive halfwaves only. To enable flowing of the current despite the presence of the diode (D22) associated with stage 20, a diode D21 of stage 20 connects its terminals 21 and 22 during positive halfwaves, the anode of diode D21 being connected to terminal 22. On the side of stage 10, a diode D11 is connected between terminals 11 and 12, its anode being connected to terminal 12.

According to this embodiment of the present invention, stage 10 also comprises an assembly 18 for discharging capacitor C11 during the halfwave when this stage is not conductive, to reset the stage to prepare for the next positive halfwave. During this discharge, it is also necessary to discharge the gate of switch K1 if said switch is of insulated-gate type. For this purpose, terminal 13 is then connected to electrode 17 of capacitor C11 by a diode D13 having its anode connected to terminal 13. Thus, the gate of switch K1 will be discharged at the same time as capacitor C11.

In the example of FIG. 3, assembly 18 is formed of a first PNP-type bipolar transistor T12 connected between electrodes 17 and 12 of capacitor C11, its emitter being connected to electrode 17. The base of transistor T12 is connected, preferably via a biasing resistor R12, to the collector of a bipolar NPN-type transistor T11 having its emitter connected to terminal 11, that is, outside of stage 10 to enable conduction during halfwaves of the opposite sign. The base of transistor T11 is connected, preferably via a biasing resistor R11, to terminal 12 of stage 10.

It can already be seen that the control circuit of this embodiment of the present invention, in its version such as illustrated in FIG. 3 where the control element is a potentiometer, appears in the form of a completely autonomous dipole.

FIGS. 4A to 4J illustrate, in timing diagrams, the operation of the circuit of FIG. 3. These timing diagrams respective show examples of shapes of signals Vac, IQ, VC11, and V13 respectively representing the voltage across capacitor C11 and the gate bias voltage of switch K1, VC21 and V23, respectively representing the voltage across capacitor C21 and the gate voltage of switch K2, the conduction periods of circuit 18 and of diode D11, the conduction periods of diode D12, the conduction periods of diode D13, the conduction periods of circuit 28 and of diode D21, the conduction periods of diode D22, and the conduction periods of diode D23.

FIGS. 4A to 4J illustrate the circuit operation to a control a purely resistive load Q. Another example applied to an inductive (or resistive and inductive) load will be described hereafter in relation with FIGS. 7A to 7J.

Initially, capacitors C11 and C12 are discharged and all diodes and transistors are off. It is assumed that at a time t0, A.C. voltage Vac is applied across the system and it is assumed, to simplify the description, that this time corresponds to the beginning of a positive halfwave. The following description will however show that the power-on time has no adverse incidence upon the operation. To simplify, no account will be taken of the forward voltage drops of the different diodes (generally, on the order of 0.6 volts) when they have no influence upon the circuit operation.

Figures 4A, 4B:
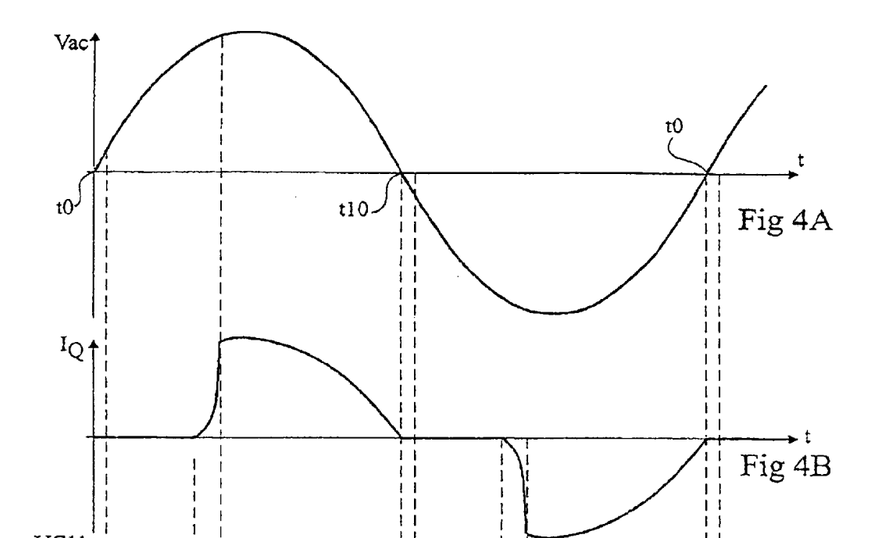
FIGS. 4A to 4J illustrate, in the form of timing diagrams, the operation of the circuit of FIG. 3.
Figure 4C:
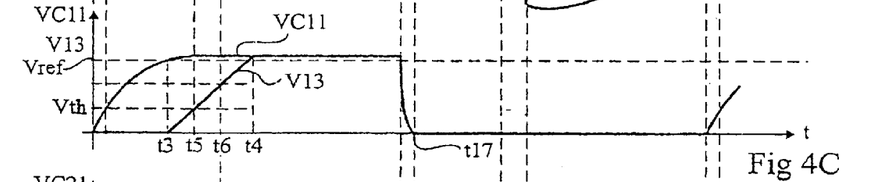
Figures 4D, 4E:
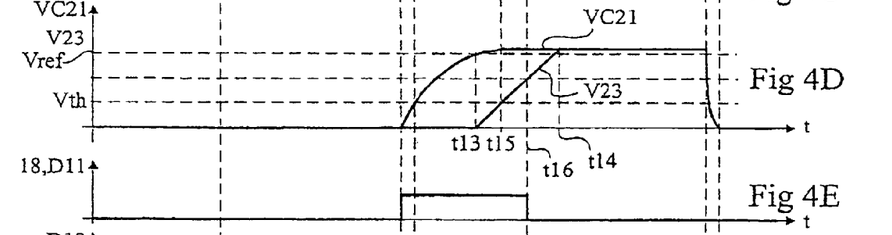
Figure 4F:
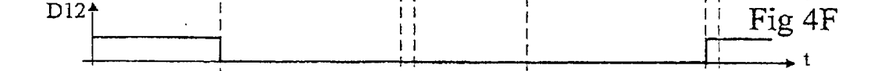
Figure 4G:
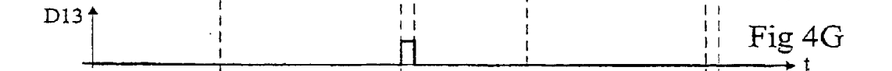
Figure 4H:
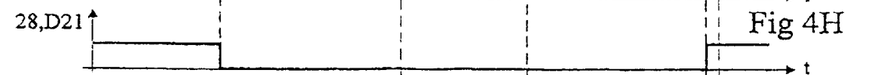
Figure 4I:
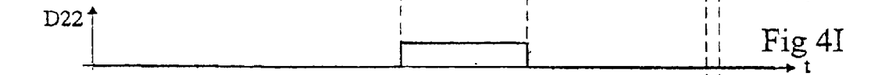
Figure 4J:
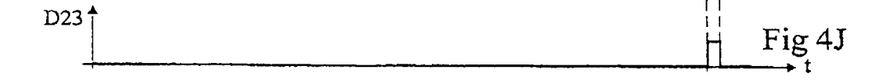

As soon as the positive halfwave starts (time t0), diodes D21 and D12 are forward biased (FIG. 4F and FIG. 4H) while diodes D22 and D11 are off (FIG. 4E and FIG. 4I). Further, since diode D21 is on, stage 28 also conducts. For the time being, it should only be noted that the fact for this stage to conduct forces a turning-off of switch K2 and a discharge of capacitor C22. The operation of the discharge assembly will be detailed hereafter in relation with the operation of stage 10. Similarly, transistors T11 and T12 of assembly 18 are both off since diode D11 is off. As a result, diode D13 is off since an initially low voltage (voltage of terminal 12) is assumed for the gate of switch K1.

A charge current of capacitor C11 thus flows from terminal 2 to terminal 3 through diode 21, potentiometer 30 and diode D12. The rapidity at which capacitor C11 charges (FIG. 4C) depends on the resistance of element 30. Capacitor C11 and the variation range of resistance 30 are sized for the voltage across capacitor C11 to be sufficient to supply comparator 16 and current source 14. Source 14 may have any structure, provided that it is controllable. For example, it circuit and potentiometer 30 to charge capacitor C22 during this negative halfwave. On the side of stage 20, the operation described hereabove in relation with the positive halfwave is reproduced during the negative halfwave.

On the side of stage 10, the conduction of diode D11 activates assembly 18 for discharging capacitor C1. In fact, the conduction of diode D11 turns on transistor T11 and the potential difference existing across capacitor C11 enables turning-on of transistor T12, which then causes the discharge of capacitor C11. Further, since the gate of switch K1 is initially at voltage V13, identical to the voltage across capacitor C11, diode D13 is forward biased, which enables discharge of the gate of switch 13 to prepare it for the next halfwave.

In fact, capacitor C discharges little after the beginning of the negative halfwave, that is, as soon as diode D11 is on. In other words, this occurs as soon as the voltage between terminals 2 and 3 of the control circuit becomes greater than—2*Vf, where Vf represents the voltage drop of a forward diode, here—(VfD11+VfD22), where VfD11 and VfD22 represent the respective forward voltage drops of diodes D11 and D22. Upon turning-off of switch K1, no current peak occurs since the turning-off occurs while the voltage across the capacitor is negative.

In FIG. 4, it has been considered that capacitor C11 was fully discharged at a time t17. From this time on, diode D13 turns off, the gate of switch K11 being discharged. Upon discharge of capacitor C11, comparator 16 switches to turn off current source 14, before capacitor C11 is fully discharged.

The low switching threshold (decreasing voltage VC11) of comparator 16 is, preferably, smaller than threshold voltage Vth of switch K1 for reasons of turn-off stability of the current source. Accordingly, the hysteresis of comparator 16 is chosen for threshold Vth to range between switching threshold Vref in the increasing direction and the low switching threshold in the decreasing direction.

At the end of a negative halfwave, control stage 10 conducts again. Said stage restarts as in the previously-described initial stage since all its components are found discharged by the discharge of capacitor C11. The only difference is that diode 23 turns on at the beginning of the second positive halfwave while it was off in may be a current source formed from a MOS transistor current mirror, supplied by the voltage across capacitor C11.

At a time t3, the voltage across capacitor C1 reaches reference voltage Vref of comparator 16. This results in a switching of this comparator, which activates current source 14. Assuming a constant current provided by source 14, the voltage of gate 13 of switch K1 starts increasing from time t3 and its increase continues until it reaches, at a time t4, the voltage of terminal 17, that is, voltage VC11. From time t4 on, gate voltage V13 of switch K1 follows the shape of voltage VC11 across capacitor C11.

Between times t3 and t4, as soon as voltage V13 reaches threshold voltage Vth of switch K1 (time t5), said switch turns on and a current starts flowing through load Q via switch K1 (FIG. 4B). The growth of current IQ in the load occurs without any peak, due to current source 14 which controls di/dt at the turning on of switch K1. It is assumed that at a time t6, current IQ in the load has joined the shape of A.C. voltage Vac, switch K1 having reached its saturated operating area.

According to this embodiment of the present invention, for this condition to be fulfilled, voltage Vref (more specifically, the switching level of comparator 16 in the increasing direction of the voltage of capacitor C11) is chosen to be much greater than threshold voltage Vth of switch K1.

At time t6 when switch K1 is fully on, terminals 2 and 3 of the control circuit are short-circuited, which turns off diodes D21 and D12 and, accordingly, stage 28.

Stage 10 is then isolated from the A.C. power supply and from the load. Accordingly, capacitor C11 does not discharge. In the example of FIG. 3, switch K1 is an MBS, that is, an insulated-gate component. The discharge of capacitor C11 linked to the gate control of this switch is thus negligible.

At time t10 when the positive halfwave of voltage Vac ends, nothing occurs. Indeed, although the voltage drops in the different diodes have been neglected, the beginning of the negative-halfwave period of operation begins when the diodes D11 and D22 turn on, and thus when a current flows through the control the first halfwave since a non-supplied initial state of the circuit had been considered.

A variation in resistance 30 results in modifying the charge aspect of capacitors C11 and C22 according to the halfwaves and, accordingly, times t3 and t13 of beginning of the conduction of switches K1 and K2 for each halfwave.

An advantage of this embodiment of the present invention is that the control circuit requires no external supply circuit and in particular no transformer.

Another advantage of this embodiment of the present invention is that the detection of the current zero performed by reading of the reverse voltage avoids occurrence of overvoltages at the turning-off of the switches on an inductive load.

Another advantage of this embodiment of the present invention is that the di/dt upon turning-on of the switches is controlled by current sources 14, 24.

Another advantage of this embodiment of the present invention is that it requires no isolation barrier to ensure the control of one or the other of the stages.

Other advantages of this embodiment of the present invention are the simplicity of the control circuit and the symmetry of the obtained control whatever the halfwave sign.

Another advantage of this embodiment of the present invention is that the provided control circuit is entirely integrable (except however for the control potentiometer). Indeed, as appears from the above-described operation, none of the control circuit diodes (especially diodes D11, D12, D21 and D22) needs holding a high voltage. Indeed, the only periods (times t6 to t10 and t16 to t0) during which the current flowing through the control circuit is not absorbed by potentiometer 30 are the periods where one of switches K1 or K2 is fully on (saturated), whereby terminals 2 and 3 are short-circuited.

Another advantage of this embodiment of the present invention is that he power dimmer thus formed requires neither inductance, nor filtering capacitor, nor external supply. This embodiment of the present invention is thus perfectly compatible with the forming of a dimmer in the form of a dipole.

Figure 5A:
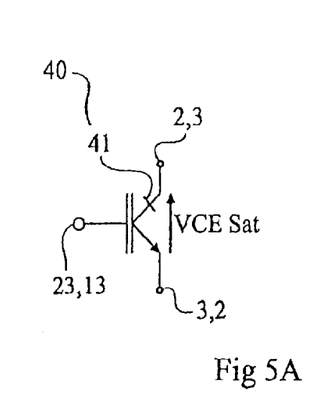
FIGS. 5A to 5D show examples of switches bidirectional for the voltage and unidirectional for the current, controllable by a circuit such as illustrated in FIG. 3.

FIGS. 5A to 5D illustrate examples of switches K1 or K2 likely to be used in a control circuit according to an embodiment of the present invention. FIG. 5A shows the diagram of an MBS-type transistor 40 such as shown in relation with FIG. 3. Such a component has the advantage of being unidirectional in current while being bidirectional for the voltage, that is, holding the reverse voltage due to an integrated diode, symbolized by a line 41 in FIG. 5A. As a result, the on-state voltage drop is limited to the saturation collector-emitter voltage VCEsat of the component.

Figure 5B:
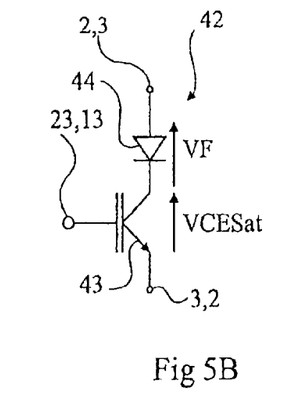

FIG. 5B illustrates a second example of a switch 42 formed of an IGBT transistor 43 in series with a diode 44. The diagram of FIG. 5B is an equivalent of MBS transistor 40 of FIG. 5A, but in which the on-state voltage drop corresponds to the sum of voltage VCEsat of IGBT transistor 43 and of voltage VF of forward diode 44.

Figure 5C:
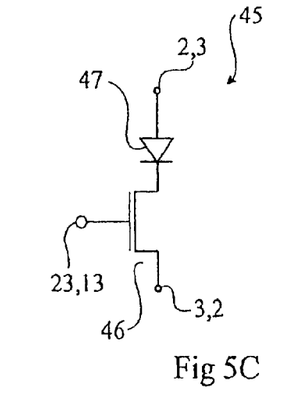

FIG. 5C shows a third example of a switch 45, here formed of a MOS transistor 46 in series with a diode 47.

Figure 5D:
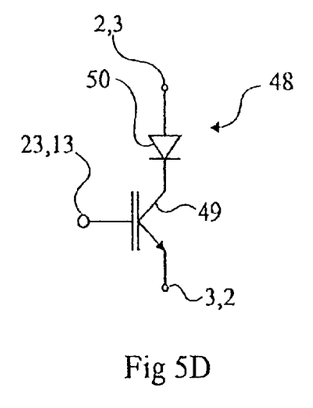

FIG. 5D illustrates a fourth example of a switch 48 formed of an NPN-type bipolar transistor 49 in series with a diode 50.

Any structure of a switch unidirectional for the current and bidirectional for the voltage (even though the voltage bidirectionality is brought by a separate diode introducing an additional voltage drop) may be used. The only possible precaution is, in the case of a bipolar transistor (FIG. 5D) or more generally of a current-controlled switch, is to provide a capacitor C11 of sufficient capacitance to ensure the provision of the base current to transistor 49 during its entire conduction period, while maintaining the supply of comparator 16 and of current source 14. In the case where it is not desired to discharge the switch control electrode, diode D13 (or D23) may be omitted.

Figure 6:
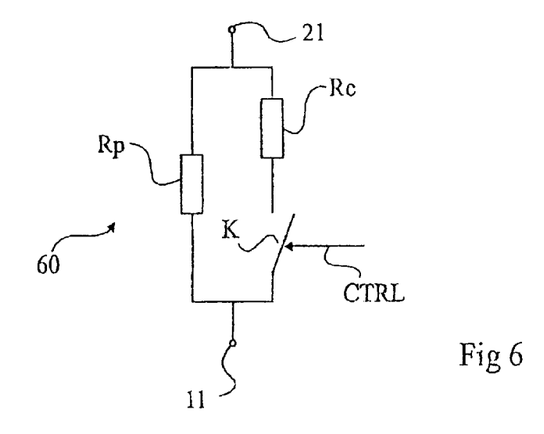
FIG. 6 shows an alternative embodiment of the element for setting the power control reference of the circuit of FIG. 3.
Figure 7A:
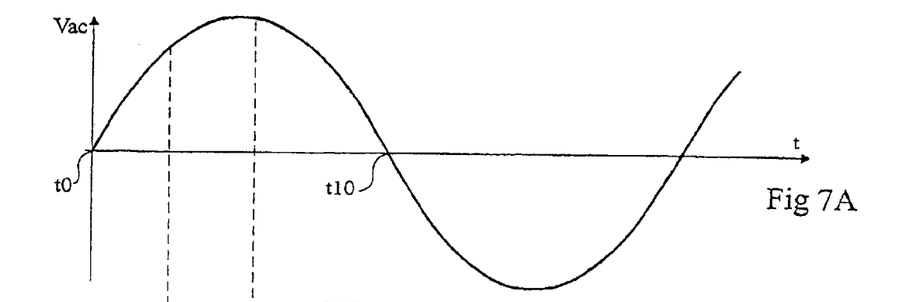
FIGS. 7A to 7J illustrate the operation of a control circuit according to an embodiment of the present invention on an inductive load.
Figure 7B:
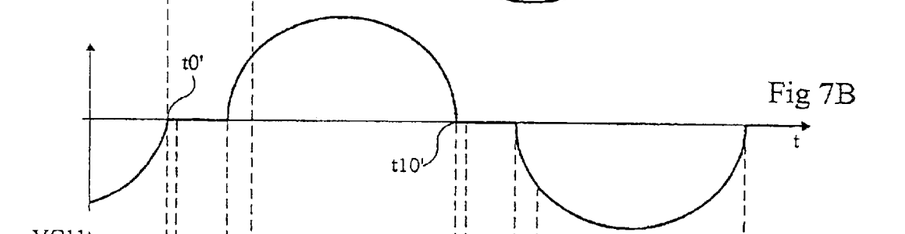
Figures 7C, 7D, 7E:
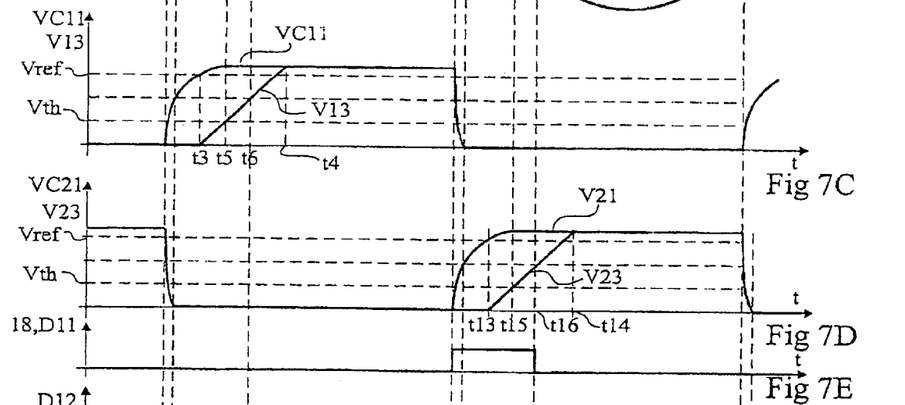
Figures 7F, 7G, 7H:
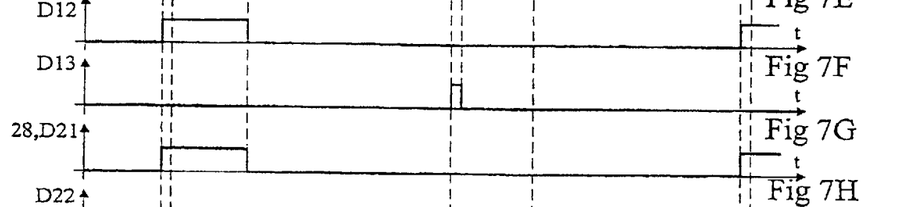
Figures 7I, 7J:
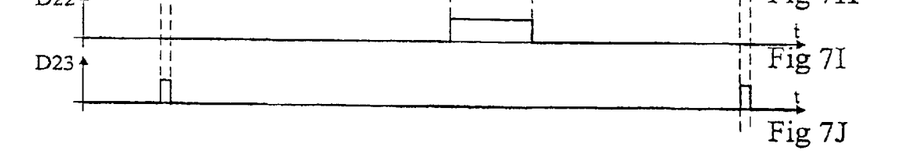

FIG. 6 shows a second embodiment of an element 60 forming a common impedance between stages 10 and 20 of FIG. 3. This embodiment can replace the potentiometer 30 of FIG. 3, and is intended to enable control of the power dimmer by a signal CTRL external to the actual power dimmer.

According to this embodiment, impedance 60 comprises, in parallel between its terminals 21 and 11, a protection resistor Rp and a series association of a resistor Rc with a switch K controlled by external signal CTRL. The function of resistor Rc is to limit the current in diodes D12, D21, and D22, D11 respectively, when switch K is on. This enables allowing a turning-on of switch K at any time with respect to supply voltage Vac. The function of resistor Rp is to guarantee an automatic turning-off at the current zero even if switch K has been off meanwhile under the effect of a disappearing of signal CTRL. It will be ascertained to choose a resistance Rp much higher than resistance Rc to enable flowing of the current in the branch of resistor Rc when the switch is on. Further, resistance Rp will have to be sufficiently high to avoid the charge of capacitors C11 and C21 reaching level Vref in a half A.C. power supply period when switch K is off.

FIGS. 7A to 7J illustrate, in timing diagrams showing the same signals as FIGS. 4A to 4J, the operation of a control circuit according to an embodiment of the present invention, connected to an at least partially inductive load Q. The main difference with respect to the timing diagrams of FIGS. 4A to 4J is that the shape of current IQ in the load has a growth in which the di/dt is naturally limited by the load inductance.

Another difference is that due to the phase shift introduced by the load inductance on the times (t0', t10', FIG. 7B) of current cancellation therein with respect to the zero crossing times (t0, t10, FIG. 7A) of voltage Vac, the charge of capacitor C11 or C21 is performed faster. As a result, time t3 of beginning of the operation of current source 14 is closer to time t0' than it is to time t0 in a purely resistive load.

For the rest, the operation of the control circuit can be deduced from the previous discussion in relation with a resistive load.

It should be noted that for an inductive load, this embodiment of the present invention requires no shunt in series with the load to detect the zero crossing of the current in the load. Accordingly, the phase shift linked to the inductive load is used to guarantee a turning-off of the switches at a time when the voltage thereacross is negative. This induces a natural detection of the current zero. An advantage then is that overvoltages are avoided at the turning-off of thyristor-type switches. Another advantage is that this reduces the losses linked to the shunt resistor, in series with the switch, in conventional circuits.

The control impedance of this embodiment of the present invention intervenes on an inductive load in the same way as for a resistive load to control the charge of capacitor C11 or C21 according to the halfwave, and thus the interval between times t'0 and t3 and t'10 and t13, respectively. Since once the capacitor has been charged and comparator 16 has been triggered, the switch control is set by current source 14, the operation of which is independent from impedance 30, the setting of time t3 effectively amounts to setting time t5 of beginning of the load conduction.

Of course, the present invention is likely to have various alterations, modifications, and improvements which will readily occur to those skilled in the art. In particular, the practical implementation of the current sources and of the comparators is within the abilities of those skilled in the art based on the functional indications given hereabove. It should however be reminded that these components do not require a supply distinct from that brought by capacitors C1 and C21 provided by the circuit of the present invention.

Further, the sizing of the capacitors and resistors, as well as of the semiconductor components, is within the abilities of those skilled in the art according to the application and to the desired operation.

Further, it should be noted that the present invention may form a power dimmer not only for lamp-type circuits, but also to ensure the control of motors due to its high-performance operation on an inductive load.

Finally, although according to a preferred embodiment, the present invention provides a symmetrical operation with identical voltages Vref for comparator 16 and for comparator 26, it does not exclude a dissymmetry according to the positive or negative halfwave, simply by modifying the voltages Vref used.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A circuit for controlling two switches bidirectional for a voltage and unidirectional for a current, assembled in anti-parallel, comprising, in series between two terminals of the anti-parallel assembly, two identical control stages respectively dedicated to each switch and between which is interposed a common impedance setting a phase angle for the turning-on of the switches, each stage comprising:
   a controllable current source for providing a current to a control electrode of the concerned switch;
   a capacitor for storing a supply voltage of at least the current source;
   an element of activation/deactivation of the current source according to the voltage across the stage capacitor; and
   an assembly for discharging the capacitor during the operation of the other stage.

2. The circuit of claim 1, wherein said current source is sized to control the di/dt at the switching-on of the concerned switch.

3. The circuit of claim 1, wherein said discharge assembly is activated as soon as the current in the concerned switch is canceled.

4. The circuit of claim 1, wherein the capacitor of each stage is in series with a first diode, between the impedance and the stage terminal which is the same as the terminal of the anti-parallel assembly.

5. The circuit of claim 4, wherein a second diode of each stage connects said impedance with said terminal of the stage which is the same as the anti-parallel assembly terminal.

6. The circuit of claim 5, wherein a third diode connects the control electrode of the switch of each stage to the electrode of said capacitor, so that said discharge assembly also discharges the control electrode of the stage switch.

7. The circuit of claim 1, wherein the respective capacitor of each stage provides the power supply necessary to all stage components.

8. The circuit of claim 1, wherein said activation/deactivation element activates said current source with which it is associated when the voltage across the capacitor of the stage becomes greater than a first threshold, itself greater than the threshold voltage of the concerned switch.

9. The circuit of claim 8, wherein said comparator deactivates said current source with which it is associated when the voltage across the capacitor of the stage becomes greater than a second threshold, itself preferably smaller than said threshold voltage of the concerned switch.

10. The circuit of claim 1, wherein each discharge assembly comprises a first transistor in parallel with the stage capacitor, the control electrode of the first transistor being connected, via a second transistor, to said impedance.

11. The circuit of claim 1, wherein said activation/deactivation element of each stage is formed of a comparator receiving at a first input the voltage across the stage capacitor and at a second input a reference voltage, said comparator being supplied by the voltage across the capacitor of the concerned stage.

12. The circuit of claim 1, wherein said impedance is formed of a potentiometer.

13. The circuit of claim 1, wherein said impedance is formed of a first resistor in parallel with a second switchable resistor, said first resistor having a much greater value than the second one.

14. A power dimmer of a load, comprising the circuit of claim 1.

15. A circuit for controlling a motor, comprising the circuit of claim 1.

16. A power-reducing circuit, comprising:
   a load node;
   a supply node operable to receive a time-varying supply signal having a positive half period during which the load node is positive relative to the supply node and having a negative half period during which the load node is negative relative to the supply node;
   a first switch coupled to the load node and to the supply node;
   a second switch coupled to the load node and the supply node;
   a first control stage coupled to the load node and operable to close the first switch during a portion of the positive half period of the supply signal; and
   a second control stage serially coupled between the first control stage and the supply node and operable to close the second switch during a portion of the negative half period of the supply signal.

17. The power-reducing circuit of claim 16 wherein the time-varying signal comprises a sinusoidal voltage signal.

18. The power-reducing circuit of claim 16 wherein:

the first control stage is operable to open the first switch when a current through the first switch decays to approximately zero; and the second control stage is operable to open the second switch when a current through the second switch decays to approximately zero.

19. The power-reducing circuit of claim 16 wherein the first control stage comprises:

a capacitor operable to receive a charging current during the positive half period of the supply signal;

a comparator operable to close the first switch when a voltage across the capacitor exceeds a first reference voltage and to open the first switch when the voltage across the capacitor is less than a second reference voltage; and a discharge circuit operable to discharge the capacitor when the charging current decays to approximately zero.

20. The power-reducing circuit of claim 16 wherein the second control stage comprises:

a capacitor operable to receive a charging current during the negative half period of the supply signal;

a comparator operable to close the second switch when a voltage across the capacitor exceeds a first reference voltage and to open the second switch when the voltage across the capacitor is less than a second reference voltage; and a discharge circuit operable to discharge the capacitor when the charging current decays to approximately zero.

21. The power-reducing circuit of claim 16, further comprising an adjustable impedance serially coupled between the first and second control stages.

22. A system, comprising:

first and second supply nodes operable to receive a time-varying supply signal having a positive half period during which the first supply node is positive relative to the second supply node and having a negative half period during which the first supply node is negative relative to the second supply node;

a load having a first node coupled to the first supply node and having a second node; and a power-reducing circuit coupled between the second node of the load and the second supply node and comprising, a first switch coupled between the load and the second supply node, a second switch coupled between the load and the second supply node, a first control stage coupled to the load and operable to close the first switch during a portion of the positive half period of the supply signal; and a second control stage serially coupled between the first control stage and the second supply node and operable to close the second switch during a portion of the negative half period of the supply signal.

23. The system of claim 22 wherein the load comprises an inductive load.

24. A method, comprising:

driving a load with a time-varying signal;

charging a first capacitor with a first current that flows through the load during a first portion of the signal;

causing a second current to flow through the load when a voltage across the first capacitor exceeds a first predetermined voltage; and prohibiting the second current from flowing through the load when the voltage across the first capacitor decays to approximately a second predetermined voltage.

25. The method of claim 24, further comprising adjusting a time that the second current flows through the load by adjusting the first current.

26. The method of claim 24 wherein a total current through the load equals a sum of the first and second currents.

27. The method of claim 24 wherein the second current is significantly greater than the first current.

28. The method of claim 24 wherein:

causing the second current to flow comprises closing a switch in series with the load; and prohibiting the second current from flowing comprises opening the switch.

29. The method of claim 24 wherein:

causing the second current to flow comprises activating a transistor in series with the load;

prohibiting the second current from flowing comprises deactivating the transistor; and the second predetermined voltage comprises a threshold of the transistor.

30. The method of claim 24, further comprising:

charging a second capacitor with a third current that flows through the load during a second portion of the signal;

causing a fourth current to flow through the load when a voltage across the second capacitor exceeds a third predetermined voltage; and prohibiting the fourth current from flowing through the load when the voltage across the second capacitor decays to approximately a fourth predetermined voltage.

31. A method, comprising:

driving a load with a time-varying signal;

charging a capacitor with a first current that flows through a load during a first portion of the signal;

causing a second current to flow through the load when a voltage across the capacitor exceeds a predetermined voltage; and prohibiting the second current from flowing through the load when the first current decays to approximately a predetermined current.

32. The method of claim 31 wherein the predetermined current equals zero current.

* * * * *